(12) United States Patent
Supper

(10) Patent No.: US 7,500,792 B2
(45) Date of Patent: Mar. 10, 2009

(54) OPTOELECTRONIC TRANSMITTING AND/OR RECEIVING ARRANGEMENT

(75) Inventor: Daniel Supper, Hohenbrunn (DE)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/142,421

(22) Filed: May 31, 2005

(65) Prior Publication Data
US 2006/0115206 A1 Jun. 1, 2006

Related U.S. Application Data

(60) Provisional application No. 60/631,101, filed on Nov. 26, 2004.

(51) Int. Cl.
*G02B 6/42* (2006.01)

(52) U.S. Cl. .................................................. 385/90

(58) Field of Classification Search ............... 385/90–91
See application file for complete search history.

(56) References Cited

U.S. PATENT DOCUMENTS

| | | | |
|---|---|---|---|
| 6,309,566 | B1 | 10/2001 | Muller et al. |
| 6,550,982 | B2 | 4/2003 | Auburger et al. |
| 6,572,280 | B2 * | 6/2003 | Hurt et al. ..................... 385/92 |
| 6,948,860 | B1 * | 9/2005 | Edwards et al. ............... 385/88 |
| 7,127,142 | B2 * | 10/2006 | Miyamae et al. .............. 385/49 |
| 7,263,248 | B2 * | 8/2007 | Windover ..................... 385/14 |
| 2003/0138009 | A1 | 7/2003 | Weigert et al. |
| 2004/0264883 | A1 * | 12/2004 | Althaus et al. ................ 385/88 |

FOREIGN PATENT DOCUMENTS

| | | |
|---|---|---|
| DE | 199 09 242 A1 | 8/2000 |
| DE | 100 34 865 A1 | 2/2002 |
| DE | 102 01 102 A1 | 7/2003 |

* cited by examiner

*Primary Examiner*—Jerry T Rahll
(74) *Attorney, Agent, or Firm*—Workman Nydegger

(57) ABSTRACT

An optoelectronic transmitting and/or receiving arrangement having: at least one optoelectronic component; an electrical printed circuit board having electrical contact areas for electrical contact-connection of the optoelectronic component; and a coupling arrangement for coupling light between the optoelectronic component and an optical waveguide to be coupled. In this case, the optoelectronic component is arranged directly on the printed circuit board and the printed circuit board is configured in such a way that a movable mounting of the optoelectronic component relative to the printed circuit board is present. A strain relief for the optoelectronic component is thereby provided as a result.

21 Claims, 2 Drawing Sheets

OPTOELECTRONIC TRANSMITTING AND/OR RECEIVING ARRANGEMENT

RELATED APPLICATION

The present application claims priority of U.S. Patent Application Ser. No. 60/631,101 filed by Daniel Supper on Nov. 26, 2004.

FIELD OF THE INVENTION

The invention relates to an optoelectronic transmitting and/or receiving arrangement having at least one optoelectronic component mounted directly onto a printed circuit board. It enables a precise coupling of an optoelectronic component to an optical waveguide with or without a waveguide core, which also withstands thermal loading.

BACKGROUND OF THE INVENTION

Optoelectronic subassemblies having a light-emitting component or a light-detecting component are known. Such sub-assemblies are also referred to as TOSA (Transmitter Optical Sub Assembly) or as ROSA (Receiver Optical Sub Assembly).

Coupling an optoelectronic component of a TOSA or ROSA to an optical fiber to be coupled requires an alignment and fixing of the respective components with extremely high precision in the µm and sub-µm range. This applies particularly when coupling monomode optical fibers. It must be ensured at the same time that during the mounting and in particular during the operation of a subassembly, the optical and electrical coupling locations undergo strain relief, i.e. no forces that might lead to a release or misalignment of the optical coupling or electrical contact-connection act on the optoelectronic component. Such forces may arise in particular as a result of thermal expansion.

DE 199 09 242 A1 discloses an optoelectronic module in which a leadframe with an optoelectronic transducer is positioned in a module housing and encapsulated with a light-transmissive, moldable material. Light is coupled in or out via an optical fiber coupled to a connector of the module housing. The housing is generally formed from metal such that it can absorb thermal stresses that occur.

DE 100 34 865 A1 describes an optoelectronic surface-mountable module in which an optoelectronic component is mounted on a transparent substrate. Substrate and component are arranged in a plastic housing with an optical window. Surface mounting on a printed circuit board can be effected by means of electrical connections led to the outer side of the plastic housing. An optical waveguide is led from the other side of the printed circuit board and coupled to the optoelectronic component via a hole in the printed circuit board. In addition, an imaging optical arrangement is preferably provided between the optical waveguide to be coupled and the optoelectronic component.

DE 102 01 102 A1 discloses a laser apparatus in which a laser diode is mounted by flip-chip mounting on a transparent substrate with an integrated optical lens and emits light into said substrate. The substrate is contact-connected via a leadframe.

It is furthermore known to arrange an optical subassembly in a TO housing. A TO housing has a base plate through which electrical connections are led, and also a metallic cap that is placed onto the base plate. A glass window is soldered in the cap in order to achieve the optical passage. A TO housing is disadvantageously associated with relatively high material costs. What is more, an imaging optical arrangement and a separate coupling unit that is welded onto the TO housing are generally required.

There is a need for cost-effective constructional module techniques which provide a high coupling efficiency for optoelectronic components and at the same time are insensitive to thermal loading.

SUMMARY OF THE INVENTION

According to the present invention an optoelectronic transmitting and receiving arrangement includes at least one optoelectronic component, an electrical printed circuit board having electrical contact areas for electrical contact-connection of the optoelectronic component, and a coupling arrangement for coupling light between the optoelectronic component and an optical waveguide to be coupled. In this case, the optoelectronic component is arranged directly on the printed circuit board and the printed circuit board is configured in such a way that a movable mounting of the optoelectronic component relative to the printed circuit board is present.

The solution according to the invention is thus based on the concept of configuring the printed circuit board in such a way that the optoelectronic component and the associated electrical contact areas are mounted movably or flexibly with respect to the printed circuit board. This has the effect that in the event of thermal expansion, the optoelectronic component can follow the thermal expansion by means of a displacement of its position, with the result that a strain relief is present and no forces act on an optical coupling location between the optoelectronic component and a further component such as an optical waveguide to be coupled. Moreover, the occurrence of forces at the electrical contact locations between the component and the printed circuit board is prevented.

In this case, a mobility of the component may be present in all three spatial directions. A mobility of the component in the z direction (perpendicular to the printed circuit board) is particularly important since thermal expansions in the z direction especially entail the risk that the electrical connection of the component to the electrical contacts of the printed circuit board or an optical connection of the component to an optical coupling element will be released or impaired. However, a mobility of the component in the x and/or y direction (i.e. in the plane of the printed circuit board) may likewise contribute to an improved strain relief and is preferably likewise provided.

The solution according to the invention is furthermore distinguished by the fact that only a small number of individual components are required. The component is mounted, for instance soldered or adhesively bonded, directly onto the printed circuit board without having been mounted onto a submount beforehand. Metallic components are not required since a strain relief is provided by means of the printed circuit board mounted in a movable manner. Moreover, it is not necessary to arrange the arrangement in a housing. A "packageless" TOSA or ROSA is present. Material and production costs are saved by virtue of the simple construction and the small number of components.

Furthermore, the solution according to the invention may be implemented both with an individual chip and with chips forming one- or two-dimensional arrays. A burn-in may advantageously be effected in the printed circuit board panel, that is to say before a printed circuit board with a multiplicity of components is singulated to form individual TOSA or ROSA units.

In the simplest configuration of the invention, a mobility of the optoelectronic component with respect to the printed circuit board is provided by virtue of the fact that the printed circuit board is produced as a flexible printed circuit board (flexible conductor, flexboard) made from a flexible material. If forces act on the component, the latter can follow the forces with local deformation of the flexible printed circuit board. Outside this local region, by contrast, the printed circuit board is not deformed, with the result that, in this respect, the optoelectronic component is mounted in a movable manner with respect to the printed circuit board. In a development of this configuration of the invention, it is provided that the printed circuit board, in a local region in which the component with the associated electrical contact areas is arranged, is composed of a particularly flexible material which can correspondingly be curved out locally to an increased extent in the z direction.

In a preferred configuration of the invention, it is provided that the printed circuit board forms a membrane on which the component and the associated electrical contact areas of the printed circuit board are arranged. A membrane in the sense of this invention is in this case understood to mean any structure that enables an improved movable mounting of the optoelectronic component on account of local material differences.

In this case, the membrane preferably has an outer membrane edge and an inner membrane area. The membrane edge has a reduced quantity of printed circuit board material. The component and the associated electrical contacts are situated on the membrane area. In this case, the membrane edge is preferably distinguished by a reduced printed circuit board thickness. Such a membrane edge enables the area of the printed circuit board that runs within the membrane edge to be movable in particular in the z direction. In this case, said membrane area may be composed of unprocessed printed circuit board material, that is to say have the same thickness as the regions of the printed circuit board which lie outside the membrane edge.

The membrane edge of reduced thickness is formed for example by trenches formed in the printed circuit board material. Said trenches may be formed on one side or on two sides in the printed circuit board. Alternatively or supplementarily, the region of reduced thickness that forms the membrane edge may also be formed by areas or holes introduced into the printed circuit board, which are provided by etching or milling, by way of example.

Furthermore, a thermally conductive material may be applied onto or into the membrane area (outside or insulated from the contact areas), for instance a copper lamina, which enables an improved dissipation of heat that emerges from the component. Further measures for improved heat dissipation may include, on the one hand, enlarged contact areas in the region of the membrane area and, on the other hand, the application of a glob top provided with a thermally conductive filler onto the component.

It is also the case when forming a membrane in the printed circuit board that the latter is preferably formed as a flexible printed circuit board.

In principle, numerous configurations of the printed circuit board are possible which enable a movable mounting of the optoelectronic component with respect to the printed circuit board. A further alternative consists for example in mounting the component on resilient arms or projections of the printed circuit board.

In a further preferred configuration of the invention, the coupling arrangement is likewise fixed on the printed circuit board. In this case, the coupling arrangement is fixed to the printed circuit board outside the membrane. In this case, thermal stresses between the coupling arrangement and the component, which are both fixed to the printed circuit board, are compensated for precisely by the movable mounting of the component relative to the printed circuit board.

The coupling arrangement preferably has at least one optical waveguide piece which is optically coupled to the component on one of its sides, said side facing the optoelectronic component, and can be coupled on its other side to an optical waveguide to be coupled. In this case, the optical waveguide piece may be formed with or without a waveguide core. Furthermore, on the side facing the component, an optical lens may be arranged, e.g. adhesively bonded, on the optical waveguide piece or an optical lens may be integrated into the latter. It may also be provided that the optical waveguide piece is arranged in a ferrule. It is then also referred to as a fiber stub. All of these variants are referred to as an optical waveguide piece in the sense of the present invention.

The optical waveguide piece represents an intermediate element in the optical coupling to an optical waveguide, which is generally coupled via an optical connector.

The optical waveguide piece is preferably coupled directly to an active zone of the optoelectronic component in the context of an end coupling. By way of example, the end side of the optical waveguide piece, said end piece facing the optoelectronic component, is adhesively bonded to the component. This configuration is particularly preferred since it is possible to dispense with a separate coupling optical arrangement between optical waveguide and component.

In this case, the term "active zone" of the component is understood to mean the coupling-in and/or coupling-out window or the coupling-in and/or coupling-out area for coupling the light in and/or out. If the component is a receiving component (e.g. a photodiode), then the active zone thus denotes the coupling-in window or the coupling-in area (coupling-in outer side) of the component for coupling in light; if the component is a transmitting element (e.g. laser, light emitting diode), then the "active zone" denotes the coupling-out window or the coupling-out area (coupling-out outer side) of the component for coupling out light.

In a further preferred configuration, the coupling arrangement comprises a coupling unit that is connected to the printed circuit board and serves for the coupling of an optical connector, the coupling unit having a central hole whose axis coincides with the optical axis of the optoelectronic component. In this case, an optical waveguide piece is not necessarily arranged in the hole. Particularly when using multimode optical waveguides, an optical coupling may be effected solely via the hole and also an optical lens that is possibly provided. The coupling unit is composed of metal or plastic, by way of example.

Preferably, however, the optical waveguide piece already mentioned is arranged in the hole of the coupling unit. In this case, the coupling unit and the optical waveguide piece may represent a preassembled unit in which the optical waveguide piece is fixedly connected to the coupling unit. In this case, the optical waveguide piece, on the side facing the printed circuit board, may project by a defined piece with respect to the underside of the coupling unit, so that it presses against the component after mounting to provide a slight prestress.

In a further preferred configuration, it is provided that the coupling arrangement and the printed circuit board have corresponding structures that enable a passive alignment of the coupling arrangement with respect to the printed circuit board. It is also possible to provide a self-alignment such as is described in the U.S. application Ser. No. 10/772,632, which is incorporated by reference in this application.

One configuration of the invention provides for the printed circuit board to have a passage hole and the optoelectronic component to be fixed on one side of the printed circuit board in such a way that the active zone of the component faces the passage hole. In this case, the optical waveguide piece is led through the passage hole, the optoelectronic component and the optical waveguide piece being optically directly coupled, in particular by means of an end coupling. In principle, however, the component and the optical waveguide and also required coupling structures may also be arranged on the same side of the printed circuit board.

The optoelectronic component is preferably formed as a prefabricated chip with an active zone and electrical contact-connections for electrical connection to the printed circuit board. In principle, however, the optoelectronic component may also be a housed unit with an optical window in which the actual light transmitter or light receiver is arranged.

BRIEF DESCRIPTION OF THE DRAWINGS

The invention is explained in more detail below on the basis of a plurality of exemplary embodiments with reference to the figures of the drawing, in which.

DESCRIPTION OF PREFERRED EXEMPLARY EMBODIMENTS

Figure 1:
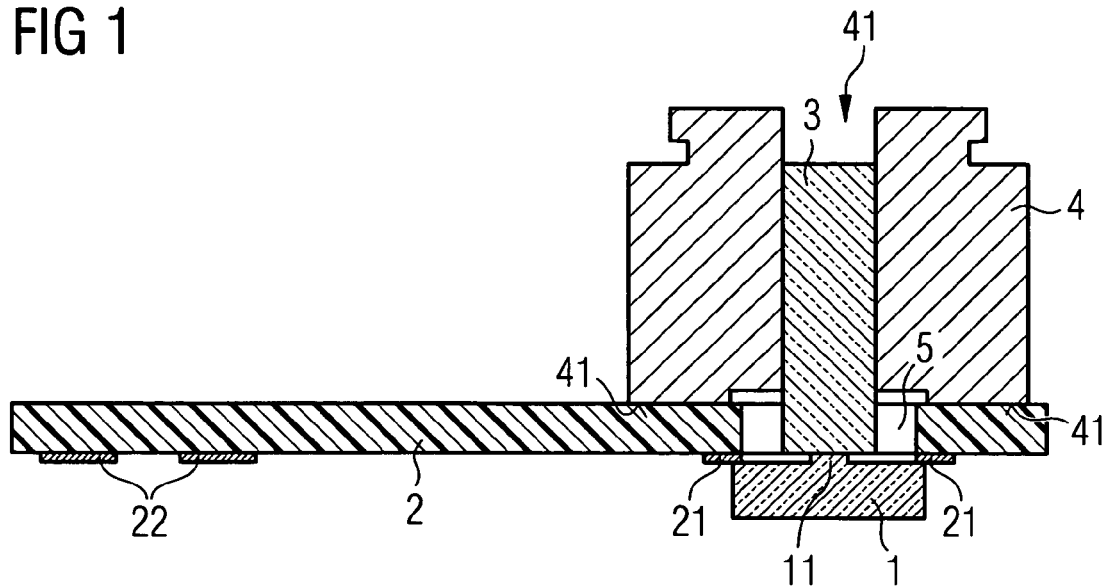
FIG. 1 shows a schematic illustration of an optoelectronic arrangement with an optoelectronic chip arranged in a movable manner on a printed circuit board.

FIG. 1 shows the basic components of the optoelectronic arrangement. The following are provided: an optoelectronic component 1, a printed circuit board 2 with electrical contact areas 21, 22, a fiber piece 3 and a coupling unit 4 that receives the fiber piece 3.

The optoelectronic component 1 is an optical transmitter, in particular a VSCEL laser diode or an LED, or an optical receiver, in particular a photodiode. In this case, the optical transmitter or the optical receiver is preferably formed as a prefabricated chip with electrical contacts for contact-connection of the chip, so that the optoelectronic component 1 is also referred to hereinafter as an optochip 1. The optochip 1 has an optically active area 11 via which light is emitted from the component or received. In the exemplary embodiment illustrated, the optochip 1 is a VCSEL laser with an optically active area 11.

The printed circuit board 2 may be any desired printed circuit board, in principle. The printed circuit board is preferably formed as a flexible printed circuit board (also referred to as a flexboard or a flexible sheet). In the case of a flexible printed circuit board, the conductor tracks (traces) are formed on an insulating, flexible substrate. On the one hand, the printed circuit board 2 contains contact areas 22 for electrically connecting the flexible printed circuit board 2 to a host printed circuit board, by way of example. On the other hand, the printed circuit board 2 has contact areas 21 for electrical contact-connection of the optochip 1.

The optochip 1 is placed by its electrical contacts, which both face the printed circuit board (not illustrated separately), onto the electrical contacts 21 by flip-chip mounting. In principle, however, the optochip 1 can also be contact-connected differently, for example by means of one or a plurality of bonding wires. The electrical contacts 21, 22 of the printed circuit board are electrically connected to one another via conductor tracks (not illustrated).

In the exemplary embodiment illustrated, the printed circuit board 2 furthermore has a passage hole or cutout 5 that extends above the optochip 1, the optically active area of the optochip pointing in the direction of the cutout 5. The fiber piece 3 is introduced into the cutout 5, to be precise in such a way that the end area of the fiber piece is directly in contact with the optochip 1 (end coupling). In this case, the optochip 1 makes direct contact with the end area of the fiber piece 3 by way of its active area (which projects somewhat in the case of the VCSEL laser illustrated in FIG. 1). The fiber piece 3 is fixed to the optochip 1 by means of a transparent adhesive, by way of example.

The fiber piece 3 is situated in a central hole 41 of the coupling unit 4. The coupling unit 4 is fixed on the printed circuit board 2 in the same way as the optochip 1. Fixing regions 41 are provided for this purpose.

The fiber piece 3 may optionally have an adhesively bonded or integrated lens (not illustrated) on its side facing the optochip 1. The fiber piece 3 may also be arranged in a ferrule. Furthermore, the fiber piece may be formed with or without a waveguide core, the latter case being taken into consideration particularly in the case of coupling to multi-mode waveguides.

Besides the components illustrated, further components of an optoelectronic transmitting and/or receiving module, such as a driver IC or a preamplifier IC, by way of example, may also be arranged on the printed circuit board 2.

The arrangement in accordance with FIG. 1 is produced as follows. Firstly, a large-area flexible printed circuit board with numerous openings 5 in the panel (i.e. by means of a multinest tool) is populated by soldering the optochips 1 onto the respective opening 5 of the printed circuit board 2. A burn-in can then be carried out in the panel. Afterward, the coupling unit 4 is aligned with or without a fiber piece and is fixed to the printed circuit board 2.

The alignment of the fiber 3 with respect to the optochip 1 may be effected by active alignment or alternatively by passive alignment using passive alignment structures. In this case, the coupling unit 4 containing the fiber piece 3 is displaced with respect to the printed circuit board 2 and fixed in the suitable position. After alignment has been effected, fiber 3 and optochip 1 are fixedly connected to one another, for example by adhesive bonding. Moreover, the coupling unit 4 is connected to the printed circuit board 2 e.g. by adhesive bonding. In the case of an end coupling between fiber 3 and optochip 1, it is possible in this case to achieve a coupling-in of light into or from the fiber without the use of a lens with a coupling efficiency of greater than 80%.

Singulation to form individual units can take place after the burn-in or alternatively after complete mounting.

Depending on whether or not the fiber piece is fixedly connected to the coupling unit 4 from the outset, there are two different possibilities for compensating for production tolerances in the fiber length, the coupling unit and the height of the flexible printed circuit board 2.

In the first variant, the fiber piece 3 is fixedly arranged in the cutout 41 of the coupling unit 4. In this case, the fiber 3 projects at the underside of the coupling unit 4, said underside facing the flexible printed circuit board 2, by a length that corresponds to the difference between the underside of the coupling unit 4 and the top side of the optochip 1 plus a production tolerance. In this case, the end area of the fiber 3 presses against the adjoining area of the optochip 1.

In a second variant, there is initially not a fixed connection between the fiber piece 3 and the coupling unit 4; the fiber piece 3 can move back and forth in the opening 41, a positively locking fit or a clearance being present. In the case of this variant, too, the fiber projects from the coupling unit at the bottom somewhat more than necessary and, in the course of alignment, is pushed back exactly into the coupling unit and subsequently adhesively bonded. In this case, it may be provided that, in a first step, the adhesive-bonding area between the fiber 3 and the optochip 1 is cured, for example optically, and, in a second step, the adhesive-bonding area between the fiber 3 and the coupling unit 4 is cured, for example by thermal curing.

A considerable practical problem in the case of the configuration of FIG. 1 consists in preventing the fiber 3 from tearing away in the case of thermal loading. It is also necessary to prevent the detachment of the electrical contacts between the optochip 1 and the printed circuit board 2 in the case of thermal loading. It must also be ensured that during operation of the optoelectronic arrangement, as a result of thermal expansion, no forces are transmitted to the optical coupling location between the fiber piece 3 and the optochip 1 and, preferably, no forces are transmitted to the electrical coupling location between the optochip 1 and the printed circuit board 2 either.

For this purpose, provision is made for achieving a strain relief of the optical (and electrical) coupling location by virtue of the fact that the optochip is mounted in rocking fashion, that is to say can move relative to the printed circuit board on which it is mounted.

For this purpose, in the case of FIG. 1, the printed circuit board 2 is formed as a flexible printed circuit board. In this case, the flexibility is to be chosen such that when forces occur, the optochip 1 can move locally relative to the rest of the printed circuit board 2, so that no forces are permanently present on the optochip 1. The flexibility of the printed circuit board material thus provides a mobility of the optochip 1.

Figure 2:
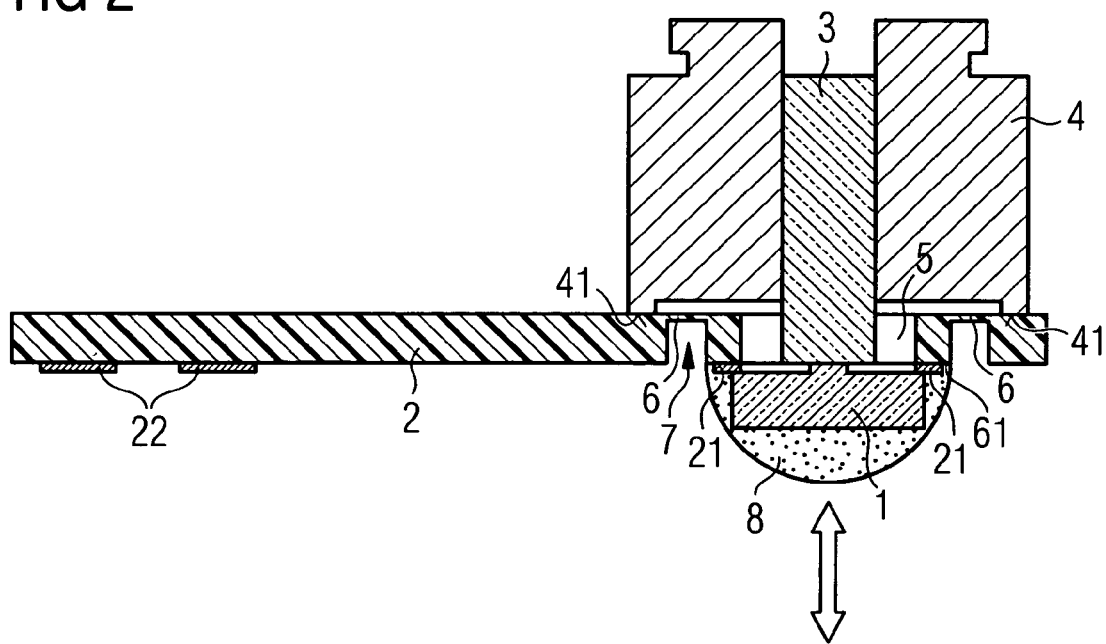
FIG. 2 shows a modification of the configuration of FIG. 1, in which the printed circuit board forms a membrane.

A different exemplary embodiment in which a rocking mounting of the optochip 1 is realized is shown in FIG. 2. In contrast to the configuration of FIG. 1, a membrane edge 6 is integrated into the flexible printed circuit board between the electrical connection areas 21 of the optochip 1 to the printed circuit board 2 and the adhesive-bonding area 41 by which the coupling unit 4 is connected to the printed circuit board 2. In this case, the coupling unit 4 is connected to the printed circuit board 2 outside the membrane edge 6 by means of the adhesive-bonding areas 41.

The membrane edge 6 is provided by a thinned region of the flexible printed circuit board 2. The membrane edge 6 defines a membrane area 61 located within the membrane edge 6. It permits the optochip 1 to be mounted flexibly (on said membrane area 6) and to be movable both in the plane of the printed circuit board (x and y directions) but also primarily perpendicularly to the plane of the printed circuit board (z direction). In the event of thermal loading occurring and leading to expansion or shrinkage of the fiber piece 3, by way of example, the optochip 1 together with the contacts 21 can concomitantly move correspondingly. In this case, the electric contact-connection of the optochip 1 is not jeopardized since the contact areas 21 are situated within the region 61 mounted in a rocking fashion and move concomitantly.

Various possibilities may be provided for contact-connecting the contact areas 21 to the further contact areas 22 of the printed circuit board. In one configuration, a thin conductor track is led via the membrane 6. Alternatively, bonding wires are led from the contact areas 21 to further contact areas of the printed circuit board 2 which are situated outside the membrane edge 6.

In this case, it may also be provided that the membrane area 61 that is mounted in a rocking fashion and is situated within the membrane edge 6 is made relatively large and, in particular, the contact areas 21 are made relatively large there. This enables a better dissipation of heat generated by the optochip 1. In order to improve the heat dissipation, it may also be provided that a copper lamina is applied onto or into the membrane area 61. Said copper lamina is in this case arranged in a manner insulated from the electrical contacts 21.

The membrane edge 6 is produced for example by etching back or deforming the material of the flexible printed circuit board 2 to form trenches 7. In this case, the membrane edge 6 is only illustrated by way of example in FIG. 2. The membrane edge 6 may also be realized by etched-free areas (e.g. a large number of holes in the material of the flexible printed circuit board) or by multiple trenches. It may also be provided that trenches and/or other cutouts are formed on both sides of the flexible printed circuit board, if appropriate also in different heights. All that is crucial is that a mobility of the optochip 1 with respect to the printed circuit board is provided.

At the end of the production process, a glob top 8 is applied to the optochip 1 in accordance with FIG. 2, said glob top serving to provide protection against external influences such as moisture and soiling. In this case, the glob top 8 may be provided with filling material that enables an additional heat dissipation via the glob top.

Figure 3:
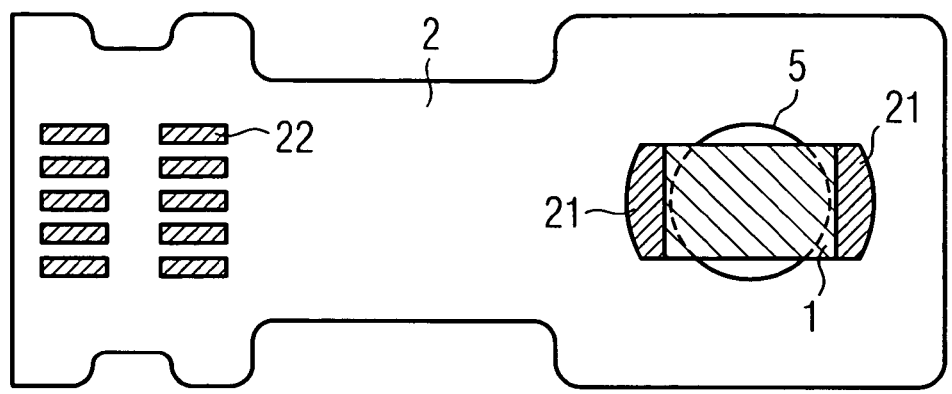
FIG. 3 shows a view from below of the arrangement of FIG. 2.

FIG. 3 shows a plan view of the overall arrangement of FIG. 2 from below, but without the membrane edge 6 and without the glob top 8. In particular, the electrical connections 22 of the printed circuit board 2 and also the electrical contacts 21 of the printed circuit board 2 can be discerned. The coupling unit 4 with the fiber piece 3 is mounted from the opposite side.

In further configurations of the invention, provision is made not of an individual optochip but of a one- or two-dimensional array of light-emitting or light-detecting components. The coupling unit then has a corresponding one- or two-dimensional array with a plurality of fiber pieces. Irrespective of whether an individual chip, a one-dimensional array or a two-dimensional array is used, the package can be realized in a very simple manner.

Figure 4:
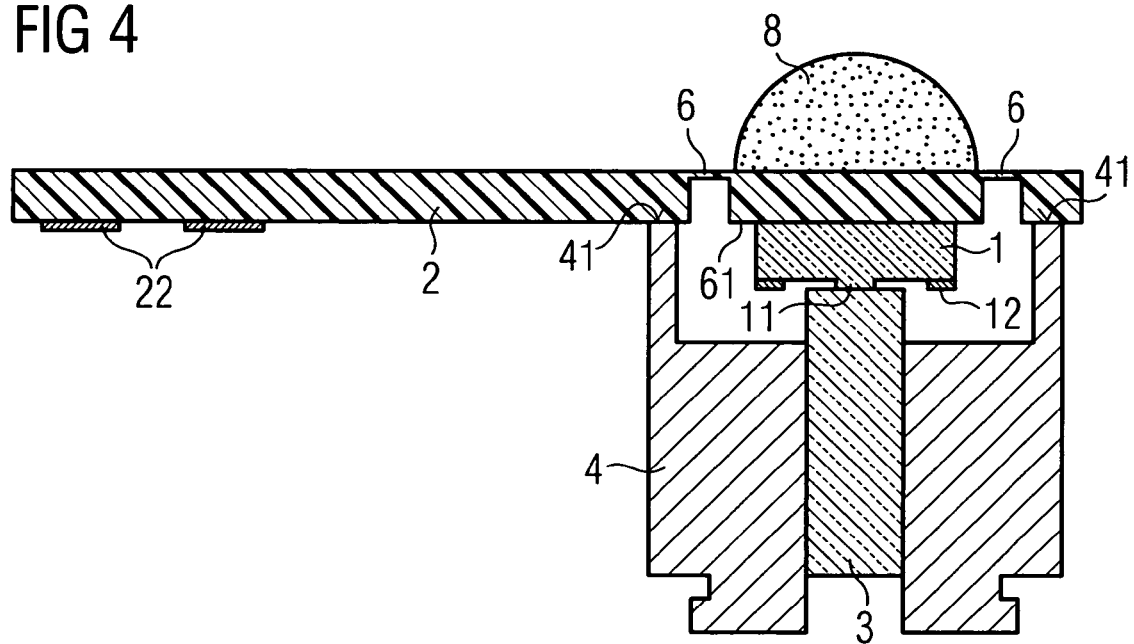
FIG. 4 shows an exemplary embodiment of an optoelectronic arrangement with an optoelectronic chip arranged in a movable manner on a printed circuit board and also with a fiber piece and a coupling unit, which are all arranged on the same side of the printed circuit board.

FIG. 4 shows a configuration of the invention in which the optochip 1 is mounted or formed in such a way that—for the case of a transmitting chip—it emits light downward away from the printed circuit board 2 and—for the case of a receiving chip—it receives light from below. The optochip 1, the fiber piece 3 and the coupling unit 4 are thus situated on the same side of the printed circuit board 2. A cutout in the flexible printed circuit board 2 is not provided.

The coupling unit 4 with the fiber piece 3 is mounted on the same side of the printed circuit board 2 as the optochip 1. In this case, in the same way as in the case of the exemplary embodiment of FIG. 2, the adhesive-bonding areas 41 of the coupling unit 4 are fixed to the printed circuit board outside the membrane edge 6. The optochip 1 is arranged on the membrane area 61 and rotated through 180° in comparison with the exemplary embodiment of FIG. 2. The electrical contacts 12 of the optochip 1 are connected via bonding wires (not illustrated) to contact-connection areas on the printed circuit board 2, the latter being situated outside the membrane edge 6. Alternatively, the bonding wires could also be connected to contact areas on the membrane area 61, in which case the latter are then connected to the contact areas 22 of the printed circuit board via thin conductor tracks led via the membrane edge 6. A glob top 8 that is arranged on the top side of the printed circuit board and is preferably filled with thermally conductive material provides an additional heat dissipation.

The rocking mounting of the optochip 1 again ensures that the optical coupling between the optochip 1 and the fiber piece 3 is not canceled or impaired in the case of thermal loading.

In further configurations of the invention (not illustrated), it is possible to increase the length of that part of the fiber piece 3 which projects from the coupling unit 4. This makes it possible to increase the mobility of the fiber in the x and y directions (i.e. in the plane of the printed circuit board). This represents a further measure for absorbing loading and stresses that occur.

In a further configuration (not illustrated), a monitor diode is additionally mounted onto the rear side of the optochip 1 formed as a transmitter, said monitor diode detecting a part of the emitted radiation and feeding it to a control device.

The embodiment of the invention is not restricted to the exemplary embodiment illustrated above. The person skilled in the art recognizes that numerous alternative embodiment variants exist which, despite their deviation from the exemplary embodiments described, make use of the teaching defined in the claims below.

I claim:

1. Optoelectronic transmitting and/or receiving arrangement comprising:
    at least one optoelectronic component,
    an electrical printed circuit board having electrical contact areas for electrical contact-connection of the optoelectronic component; and
    a coupling arrangement for coupling light between the optoelectronic component and an optical waveguide to be coupled;
    wherein the optoelectronic component is arranged directly on the printed circuit board;
    wherein the printed circuit board is configured such that a movable mounting of the optoelectronic component relative to the printed circuit board is present;
    wherein the printed circuit board comprises a membrane on which the component and the associated electrical contact areas of the printed circuit board are arranged;
    wherein the membrane has an outer membrane edge and an inner membrane area, the membrane edge having a reduced quantity of printed circuit board material and the component and the associated electrical contacts being situated on the membrane area; and
    wherein the membrane edge has a printed circuit board thickness that is smaller than a thickness of the inner membrane area.

2. Arrangement according to claim 1, the coupling arrangement comprising a coupling unit that is connected to the printed circuit board and serves for the coupling of an optical connector, the coupling unit having a central hole whose axis coincides with the optical axis of the optoelectronic component.

3. Arrangement according to claim 1, further comprising a thermally conductive material applied onto or into the membrane area.

4. Arrangement according to claim 1, wherein the optoelectronic component comprises a prefabricated chip with an active zone and electrical contact-connections for electrical connection to the printed circuit board.

5. Arrangement according to claim 1, wherein the optoelectronic component comprises one of a VCSEL laser diode, an LED and a photodiode.

6. Arrangement according to claim 1, wherein the membrane edge comprises trenches formed in the printed circuit board material.

7. Arrangement according to claim 1, wherein the coupling arrangement is fixedly connected to the printed circuit board.

8. Arrangement according to claim 7, wherein the coupling arrangement and the printed circuit board comprise corresponding structures for enabling a passive alignment of the coupling arrangement with respect to the printed circuit board.

9. Arrangement according to claim 1, the coupling arrangement comprising at least one optical waveguide piece which is optically coupled to the component on a first side facing the optoelectronic component, and can be coupled on an opposing second side to the optical waveguide to be coupled.

10. Arrangement according to claim 9, wherein the first side comprises a first end of the optical waveguide piece and is directly coupled to an active zone of the optoelectronic component.

11. Arrangement according to claim 10, wherein the first end of the optical waveguide piece is adhesively bonded to the component.

12. Arrangement according to claim 9, wherein the optical waveguide piece is arranged in a hole of the coupling arrangement.

13. Arrangement according to claim 12, wherein the component, the coupling unit and the optical waveguide piece are arranged on the same side of the printed circuit board.

14. Arrangement according to claim 12, wherein the coupling arrangement and the optical waveguide piece comprise a preassembled unit in which the optical waveguide piece is fixedly connected to the coupling arrangement.

15. Arrangement according to claim 14, wherein the optical waveguide piece, on a side facing the printed circuit board, projects by a defined amount with respect to the underside of the coupling arrangement.

16. Arrangement according to claim 1, wherein the coupling arrangement is fixedly connected to the printed circuit board outside the membrane.

17. Arrangement according to claim 1, wherein the optoelectronic component is fixed mounted on one side of the printed circuit board such that an active zone of the component faces a passage hole defined by the circuit board.

18. Arrangement according to claim 17, wherein the optical waveguide piece extends through the passage hole, and wherein the optoelectronic component is optically directly coupled to the optical waveguide piece.

19. Arrangement according to claim 17, wherein the passage hole is formed adjacent to the membrane of the printed circuit board.

20. Arrangement according to claim 17, wherein the optoelectronic component is enveloped with an encapsulation material on a side remote from the passage hole.

21. An apparatus comprising:
    a printed circuit board including a first portion, a second portion, and conductive tracks extending between the first and second portions, wherein the printed circuit board defines a passage hole;
    an optoelectronic component mounted on the second portion of the printed circuit board and electrically connected to the conductive tracks, wherein the second portion of the printed circuit board comprises an membrane on which the component is arranged, wherein the membrane has an outer membrane edge and an inner membrane area, the membrane edge having a reduced quantity of printed circuit board material and the component being situated on the membrane area, and wherein the membrane edge has a printed circuit board thickness that is smaller than a thickness of the inner membrane area;

a coupling arrangement mounted on the second portion of the printed circuit board, the coupling arrangement including means for optically coupling an optical fiber to the optoelectronic component;

wherein the printed circuit board includes means for facilitating movement of the second portion perpendicular to the first portion and parallel to the first portion, thereby facilitating displacement of the position of the optoelectronic component and the coupling arrangement relative to the first portion of the printed circuit board without disconnecting the optoelectronic component from the conductive tracks.

* * * * *

UNITED STATES PATENT AND TRADEMARK OFFICE
CERTIFICATE OF CORRECTION

PATENT NO. : 7,500,792 B2  
APPLICATION NO. : 11/142421  
DATED : March 10, 2009  
INVENTOR(S) : Supper Page 1 of 1

It is certified that error appears in the above-identified patent and that said Letters Patent is hereby corrected as shown below:

Drawings
Sheet 1, please replace the current drawing of FIG. 1 with the figure depicted below in which "opening 40" has been correctly labeled.

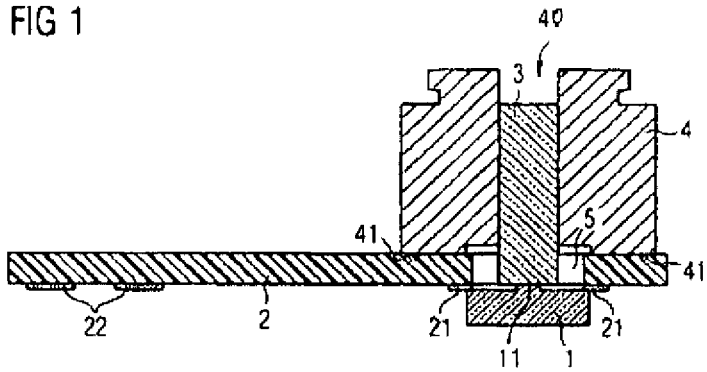

Column 6
Line 18, change "41" to --40--
Line 63, change "41" to --40--

Column 7
Line 5, change "41" to --40--

Column 10 Claim 21
Line 62, change "an" to --a--

Signed and Sealed this
First Day of February, 2011

David J. Kappos
*Director of the United States Patent and Trademark Office*